United States Patent
Dzengeleski et al.

(10) Patent No.: US 7,564,048 B2
(45) Date of Patent: Jul. 21, 2009

(54) AUTOMATED FARADAY SENSOR TEST SYSTEM

(75) Inventors: Joseph P. Dzengeleski, Newton, NH (US); Greg Gibilaro, Topsfield, MA (US); Gregg Norris, Rockport, MA (US); David Olden, Acton, MA (US); Tamer Onat, Winchester, MA (US)

(73) Assignee: Varian Semiconductor E1quipment Associates, Inc., Gloucester, MA (US)

( * ) Notice: Subject to any disclaimer, the term of this patent is extended or adjusted under 35 U.S.C. 154(b) by 165 days.

(21) Appl. No.: 11/479,397

(22) Filed: Jun. 30, 2006

(65) Prior Publication Data
US 2008/0073551 A1 Mar. 27, 2008

(51) Int. Cl.
*G21K 5/10* (2006.01)
(52) U.S. Cl. .............................. 250/492.21; 250/492.1; 250/397; 702/65; 324/71.3
(58) Field of Classification Search ............ 250/492.21, 250/397, 492.1, 492.2, 492.22, 492.3; 702/65; 324/71.3
See application file for complete search history.

(56) References Cited

U.S. PATENT DOCUMENTS 6,300,642 B1 * 10/2001 Cho et al. .............. 250/492.21
2005/0133728 A1 * 6/2005 Onat et al. ................... 250/397
2005/0212503 A1 * 9/2005 Deibele ...................... 324/71.3
2007/0100567 A1 * 5/2007 Aggarwal et al. ............. 702/65
2007/0215814 A1 * 9/2007 Kitchen ....................... 250/397

OTHER PUBLICATIONS

Marcellini, F., et al.: "Design of a Tapered Stripline Fast Faraday Cup for Measurements on Heavy Ion Beams: Problems and Solutions"; Beam Instrumentaiton Workshop, 1998.

* cited by examiner

*Primary Examiner*—David A Vanore
*Assistant Examiner*—Michael Maskell

(57) ABSTRACT

A Faraday sensor test system includes a Faraday sensor configured to intercept a quantity of ions incident on said Faraday sensor, a primary conductor and a test conductor coupled to said Faraday sensor, and a controller. The controller is configured to automatically provide a test current into the test conductor in response to a test condition. The controller is further configured to receive a return current from the primary conductor in response to the test current and to compare the return current to a value representative of the test current to determine a condition of a conductive path comprising the test conductor, the Faraday sensor, and the primary conductor.

17 Claims, 4 Drawing Sheets

AUTOMATED FARADAY SENSOR TEST SYSTEM

FIELD

This disclosure relates to Faraday sensors, and more particularly, to an automated Faraday sensor test system.

BACKGROUND

A Faraday sensor is configured to intercept a quantity of ions incident on the Faraday sensor. As the ions strike the Faraday sensor, an electrical circuit connected to the Faraday sensor senses a current representative of the quantity of ions or the ion beam current. In one instance, the ions may be positive ions and the electrical circuit may include a current meter coupled to ground. As the positive ions strike the Faraday sensor, electrons are drawn from ground through the current meter to combine with the positive ions. The current meter measures the electron flow which is representative of the ion beam current. One type of Faraday sensor may have a cross sectional cup shape and may be referred to as a Faraday cup.

The Faraday sensor, the electrical circuit connected to the Faraday sensor, and the connections there between and elsewhere in the electrical circuit may suffer from a variety of fault conditions that can lead to inaccurate ion beam current measurements. Such fault conditions may include wiring faults or Faraday sensor faults. Wiring faults may include unsatisfactory connections or damaged conductors such as crushed or burned conductors. Faraday sensor faults may occur from conductive particle buildup on insulators of the Faraday sensor. In one instance, the particle buildup may be graphite buildup caused by ions striking a graphite Faraday sensor. Such fault conditions may manifest themselves as short circuits to ground, resistance to ground, capacitance to ground, and/or other circuit anomalies.

Inaccurate ion beam current measurements from the Faraday sensor system can lead to degradation in the performance of a system utilizing the Faraday sensor system. For example, Faraday sensors are commonly utilized in ion implanters. An ion implanter generates a quantity of ions and directs the ions to a wafer for implantation. The Faraday sensor system may be utilized to sense a quantity of ions for implantation and provide an electrical signal representative of the quantity of ions to an associated controller such as a dose controller. The dose controller may receive and monitor the electrical signal from the Faraday sensor system to monitor and control the implant so that the wafer is implanted with the proper dose. An inaccurate ion beam current reading from the Faraday sensor system can lead to inaccurate dose control by the dose controller thereby creating an undesirable over-dose or under-dose implantation into the wafer. Accordingly, it would be desirable to test the Faraday sensor system.

One conventional method of testing the Faraday sensor includes a technician manually coupling a high voltage across the Faraday sensor to monitor the continuity of the Faraday sensor. Drawbacks with this conventional approach include the human involvement necessary to test the Faraday sensor. Such human involvement requires expertise that may not be readily available and is subject to human error in making an assessment of the condition of the Faraday sensor. Such conventional manual tests may also not be made as often as desired given the human involvement required.

Accordingly, there is a need in the art for an automated Faraday sensor test system.

SUMMARY

According to a first aspect of the invention, a Faraday sensor test system is provided. The Faraday sensor test system includes a Faraday sensor configured to intercept a quantity of ions incident on the Faraday sensor, a primary conductor and a test conductor coupled to the Faraday sensor, and a controller. The controller is configured to automatically provide a test current into the test conductor in response to a test condition. The controller is further configured to receive a return current from the primary conductor in response to the test current and to compare the return current to a value representative of the test current to determine a condition of a conductive path including the test conductor, the Faraday sensor, and the primary conductor.

According to another aspect of the invention, an ion implanter is provided. The ion implanter includes an ion generating system configured to generate a plurality of ions and direct the plurality of ions to a wafer for implantation, and a Faraday sensor test system. The Faraday sensor test system includes a Faraday sensor configured to intercept a quantity of the plurality of ions incident on the Faraday sensor, a primary conductor and a test conductor coupled to the Faraday sensor, and a controller. The controller is configured to automatically provide a test current into the test conductor in response to a test condition. The controller is further configured to receive a return current from the primary conductor in response to the test current and to compare the return current to a value representative of the test current to determine a condition of a conductive path including the test conductor, the Faraday sensor, and the primary conductor.

According to yet another aspect of the invention, a method is provided. The method includes providing a test current into a test conductor coupled to a Faraday sensor, the test current provided automatically in response to a test condition, receiving a return current from a primary conductor coupled to the Faraday sensor in response to the test current, and comparing the return current to a value representative of the test current to determine a condition of a conductive path including the test conductor, the Faraday sensor, and the primary conductor.

BRIEF DESCRIPTION OF THE DRAWINGS

For a better understanding of the present disclosure, reference is made to the accompanying drawings in which.

DETAILED DESCRIPTION

The invention is described herein in connection with an ion implanter. However, the invention can be used with other systems and processes that utilize a Faraday sensor, including, but not limited to medical systems and experimental ion accelerators. Thus, the invention is not limited to the specific embodiments described below.

Figure 1:
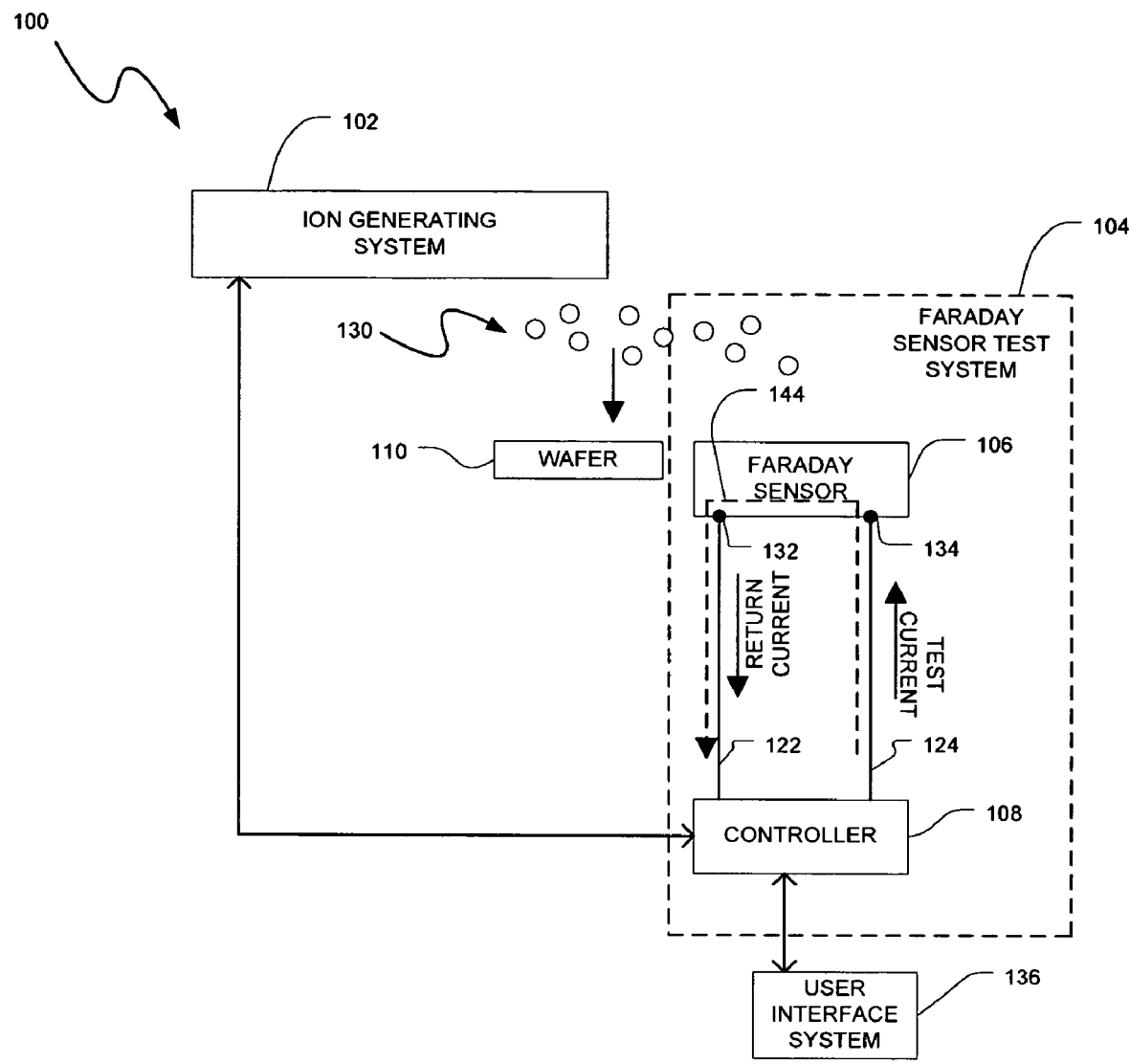
FIG. 1 is a block diagram of an ion implanter including a Faraday sensor test system consistent with an embodiment of the invention.

FIG. 1 illustrates a block diagram of an ion implanter 100 including an ion generating system 102 and a Faraday sensor test system 104 consistent with an embodiment of the invention. The ion generating system 102 is configured to generate a plurality of ions 130 and direct the plurality of ions 130 to a wafer 110. The wafer 110 may be a semiconductor wafer fabricated from any type of semiconductor material such as silicon or any other material that is to be implanted with the plurality of ions 130. The wafer can take various physical shapes such as a common disk shape.

In one embodiment, the ion generating system 102 can generate a well-defined ion beam that includes the plurality of ions 130. In this instance, this ion generating system 102 can include an ion source for converting a gas or a solid material into the well-defined ion beam. The ion beam may be mass analyzed to eliminate undesired ion species, accelerated to a desired energy, and directed toward the wafer 110. The ion beam may be distributed over the wafer by beam scanning, by wafer movement, or by a combination of beam scanning and wafer movement. The ion beam may be a spot beam or a ribbon beam having a long dimension and a short dimension. In one instance, the long dimension of the ribbon beam may be at least as wide as the wafer.

The ion generating system 102 could also be a plasma doping system. In a plasma doping system, the wafer 110 is placed on a conductive platen, which functions as a cathode and is located in a plasma doping chamber. An ionizable process gas containing the desired dopant material may be introduced into the chamber, and a voltage pulse may be applied between the platen and an anode or the chamber walls, causing formation of a plasma having a plasma sheath in the vicinity of the wafer 110. The applied pulse causes ions in the plasma to cross the plasma sheath and to be implanted into the wafer 110. The depth of implantation is related to the voltage applied between the wafer and anode. Very low implant energies can be achieved in plasma doping systems.

The Faraday sensor test system 104 may include a Faraday sensor 106, a primary conductor 122, a test conductor 124, and a controller 108. The Faraday sensor 106 is configured to intercept a quantity of ions 130 incident on the Faraday sensor. Although the Faraday sensor 106 is illustrated as positioned proximate an outside edge of the wafer 110, the Faraday sensor 106 may be positioned in differing locations of the ion implanter 100 as long as it intercepts a quantity of the ions 130. The Faraday sensor 106 may include a sheet fabricated of material such as graphite insulated from ground by an insulator. In one embodiment, the Faraday sensor 106 may be a Faraday cup. The primary conductor 122 may be coupled to the Faraday sensor 106 at a first location 132, while the test conductor 124 may be coupled to the Faraday sensor 106 at a different location 134. Both the primary conductor 122 and the test conductor 124 may also be coupled to the controller 108.

The controller 108 can be or include a general-purpose computer or network of general-purpose computers that may be programmed to perform desired input/output functions. The controller 108 can also include other electronic circuitry or components, such as application specific integrated circuits, other hardwired or programmable electronic devices, discrete element circuits, etc. The controller 108 may also include communication devices, data storage devices, and software. In one embodiment, the controller 108 may be a dose controller of the ion implanter 100 that monitors a current representative of the quantity of ions 130 incident on the Faraday sensor 106. In response, the dose controller may control the ion generating system 102 to control the implant dose so that the wafer 110 is implanted with a desired dose.

The ion implanter 100 may also include a user interface system 136. The user interface system 136 may include, but not be limited to, devices such as touch screens, keyboards, user pointing devices, displays, printers, etc. to allow a user to input commands and/or data and/or to monitor the ion implanter 100 including the Faraday sensor test system 104. Desired recipes including, but not limited to, beam energy, beam current, ion species, etc. of an implant may be input by a user via the user interface system 136. Desired test conditions to trigger a test of the Faraday sensor 106 by the Faraday sensor test system 104 may also be programmed by a user via the user interface system 136.

In operation, the controller 108 is configured to automatically provide a test current into the test conductor 124 in response to a test condition. The test current may include, but not be limited to, DC current, pulsed DC current, and AC current. The test condition may be an elapsed time interval since a previous test. The test condition may be a quantity of wafers implanted since a previous test, e.g., in one instance this may be about one hundred wafers, but it could also be programmed via the user interface system 136 to be as little as one wafer if desired. The test condition may also be a change of recipes of the ion implanter 100. The test condition may also be an energy level of the ions 130 implanted into the wafer 110 during implantation. Once the test condition occurs, the controller 108 may wait to provide the test current until a quantity of the ions 130 are not incident on the Faraday sensor 106.

In response to the test current provided into the test conductor 124, a return current returns to the controller 108 via the primary conductor 122. The controller 108 is further configured to compare the return current to a value representative of the test current to determine a condition of the conductive path 144 illustrated in phantom. The conductive path 144 includes the test conductor 124, the Faraday sensor 106, and the primary conductor 122.

Absent any fault conditions along the conductive path 144, the return current should be approximately equal to the value representative of the test current. For a DC current, the DC return current should be within a threshold level of the DC test current. For an AC current, the amplitude, frequency, and waveshape of the AC return current should also be within certain threshold levels of the AC test current. If they are not, the controller 108 may output a fault signal representative of a fault condition along the conductive path 144. In response to the fault signal, the user interface system 136 may provide an alert indicative of the presence of the fault condition. The alert may be an audio alarm, a visual alarm, etc. Also in response to the fault signal, the controller 108 may be configured to prevent the ion generating system 102 from implanting additional ions 130. This could occur by positioning the wafer 110 out of the path of the ions 130, disabling the ion generating system 102, etc. Once the fault condition is corrected, the controller 108 may then allow further implantation of ions 130.

Figure 2:
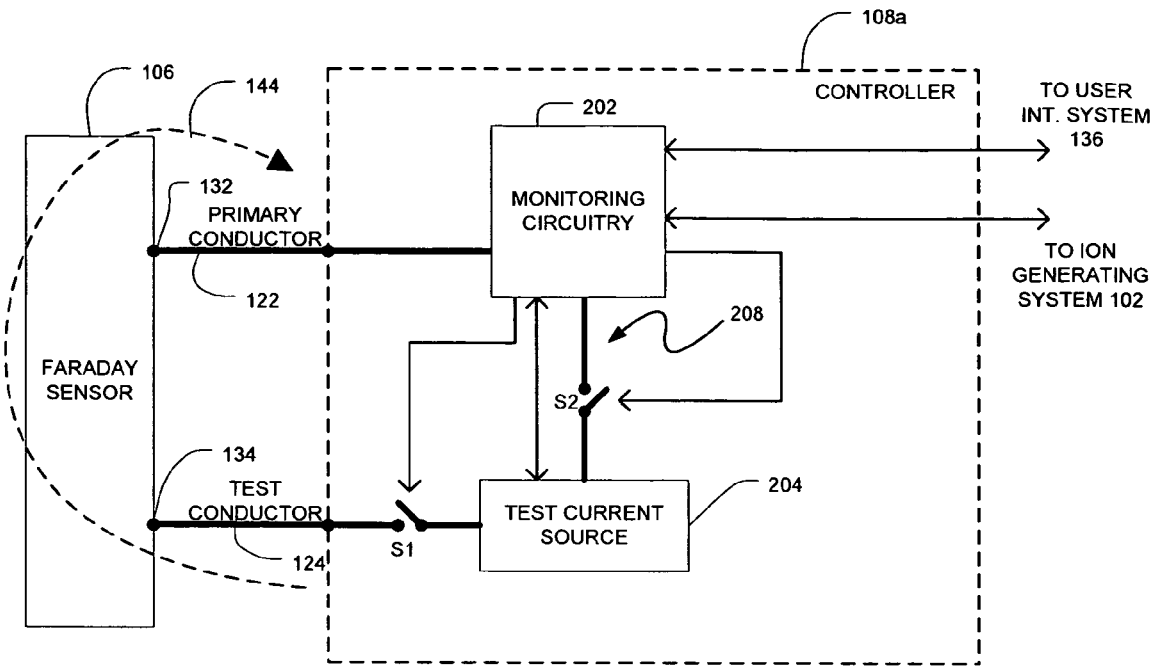
FIG. 2 is a block diagram of an embodiment of the controller of FIG. 1.

Turning to FIG. 2, a block diagram of one embodiment 108a of the controller 108 of FIG. 1 is illustrated. The controller 108a may include a test current source 204, monitoring circuitry 202, a first switch S1, and a second switch S2. The test current source 204 is configured to provide the test current to the test conductor 124. The test current source 204 can include differing current sources, and the test current may include, but not be limited to, a DC current, a pulsed DC current, or an AC current. In one embodiment, the test current source 204 may include a 10 volt source in series with a 5.555 kilo-ohm resistor to provide a DC test current of approximately 1.8 milliamps (mA). The first switch S1 may be coupled to the test conductor 124 to couple and de-couple the test current source 204 from the test conductor 124. The second switch S2 may be coupled to a direct path 208 between the test current source 204 and the monitoring circuitry 202.

In operation, the monitoring circuitry 202 may open the first switch S1 and close the second switch S2 to bypass the conductive path 144. The test current from the test current source 204 may then be provided directly to the monitoring circuitry 202 via the direct path 208. The monitoring circuitry 202 may then receive, monitor, and store a value representative of the test current that it receives via the direct path 208.

The monitoring circuitry 202 may then close the first switch S1 and open the second switch S2. The test current provided by the test current source 204 may then be provided into the test conductor 124 in response to a test condition. Current may then flow along the conductive path 144 including the test conductor 124, the Faraday sensor 106, and the primary conductor 122. In response to the test current, a return current may return to the monitoring circuitry 202 via the primary conductor 122.

Figure 3:
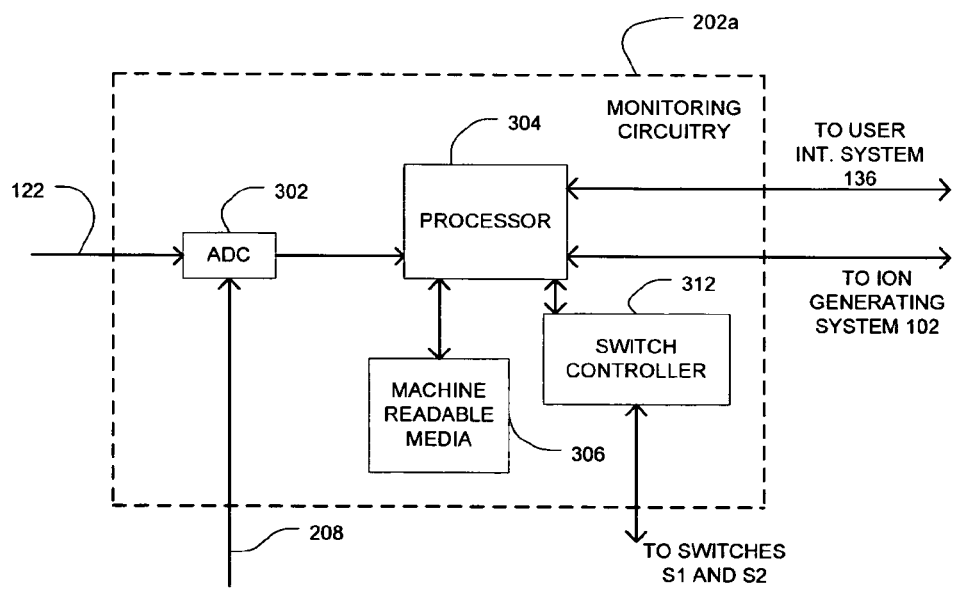
FIG. 3 is a block diagram of an embodiment of the monitoring circuitry of FIG. 2.

Turning to FIG. 3, a block diagram of one embodiment 202a of the monitoring circuitry 202 of FIG. 2 is illustrated. The monitoring circuitry 202a may include an analog to digital converter (ADC) 302, a processor 304, machine readable media 306, and a switch controller 312. The ADC 302 may receive an analog signal and convert it to a digital signal. In one embodiment, the ADC may provide a 16-bit output digital signal to the processor 304. The processor 304 may include one or more processors known in the art such as those commercially available from Intel Corporation to serve as the central processing unit of the controller. The machine readable media 306 may include one or more machine readable storage media such as random-access memory (RAM), dynamic RAM (DRAM), magnetic disk (e.g., floppy disk and hard drive), optical disk (e.g., CD-ROM), and/or any other device that can store instructions for execution, e.g., by the processor 304. The switch controller 312 may communicate with the processor 312 and provide appropriate switching signals to control switches such as switches S1 and S2 of FIG. 2.

Figure 4:
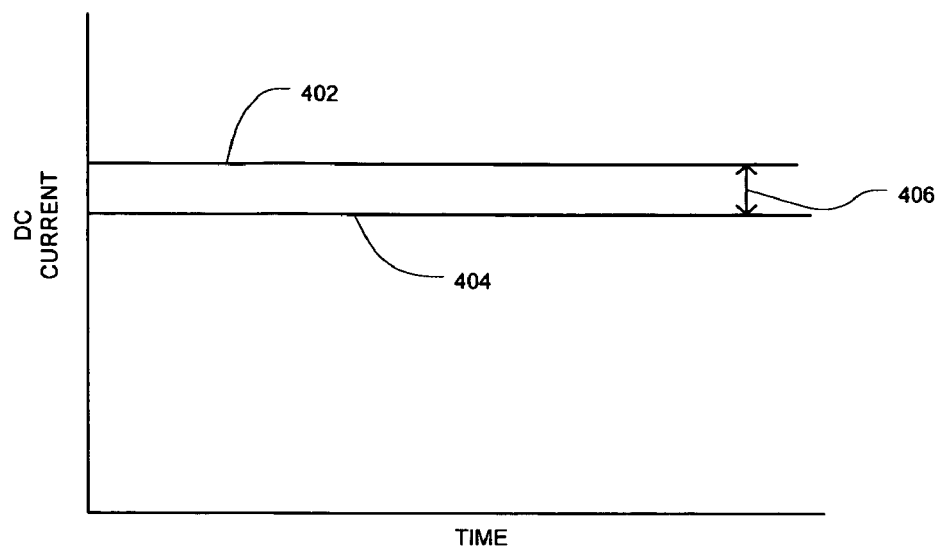
FIG. 4 is a plot of DC current versus time for different DC currents.

FIG. 4 illustrates a plot of DC current versus time when the test and return currents are DC currents. Plot 402 is a plot representative of a value of a DC test current while plot 404 is representative of a DC return current. The difference 406 between the two plots 402 and 404 is representative of a condition of the conductive path 144. For example with reference to FIGS. 2 and 3, the processor 304 may instruct the switch controller 312 to open the first switch S1 and close the second switch S2. The test current source 204 may then provide a DC test current to the ADC 302 via the direct path 208. The ADC 302 may convert the received analog signal to a first digital signal, and the processor 304 may direct storage of the first digital signal in the machine readable media 306. The first digital signal is therefore representative of a value of the DC test current received by the monitoring circuitry 202a.

In response to a test condition, the processor 304 may instruct the switch controller 312 to close the first switch S1 and open the second switch S2. The test current source 204 may then provide the DC test current to the test conductor 124 when no ions are incident on the Faraday sensor. In response, a return current from the primary conductor 122 may then be provided to the ADC 302. The ADC 302 may convert the analog return DC current to a second digital signal. The second digital signal is therefore representative of the DC return current received by the monitoring circuitry 202a. The processor 304 may then compare the first digital signal earlier stored to the second digital signal to ascertain a difference between them. If the difference is greater than a threshold level, the processor 304 may output the fault signal representative of a fault condition on the conductive path 144. In one embodiment, the threshold level is 1% of the DC test current as measured by the monitoring circuitry 202 when the conductive path 144 is bypassed and the DC test current is provided to the monitoring circuitry via the direct path 208.

Figure 5:
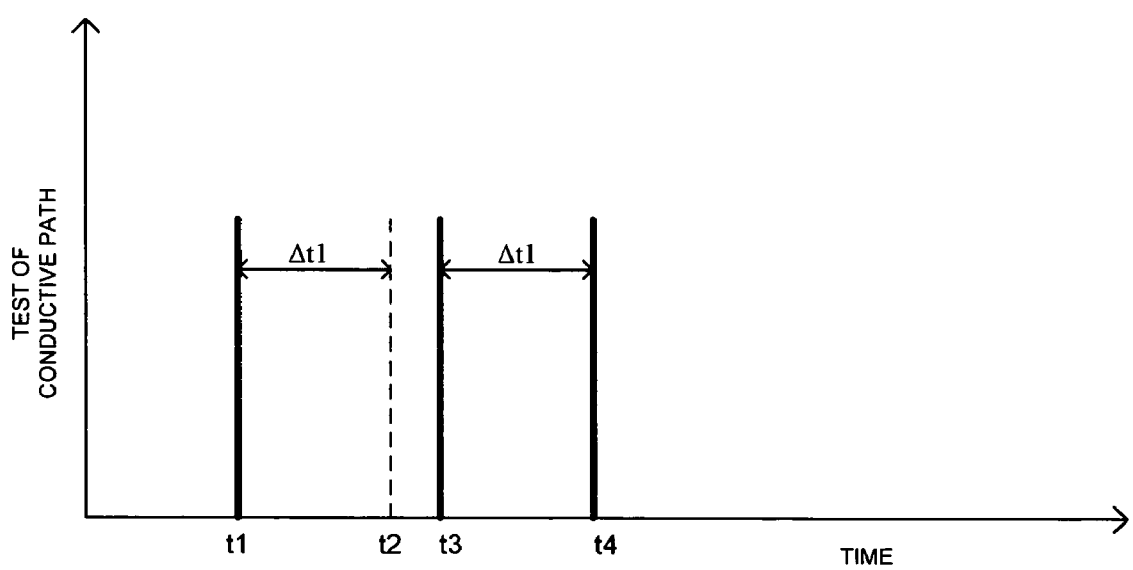
FIG. 5 is a plot of tests occurring in response to an elapsed time interval since a previous test.

Turning to FIG. 5, plots illustrating tests occurring at different times in response to an elapsed time interval test condition are illustrated. A first test may occur at time t1. The test condition in this example is elapsed time interval Δt1. When the elapsed time interval Δt1 has expired at time t2, ions may be implanting into the wafer. Accordingly, the controller may wait until time t3 when ions are no longer incident on the wafer to provide the test current into the test conductor 124. When the elapsed time interval Δt1 has expired at time t4, ions may not be implanting into the wafer. Accordingly, the controller may provide the test current into the test conductor 124 at time t4. The elapsed time interval Δt1 from the previous test may remain constant or can be adjusted. A user may program a particular desired elapsed time interval. The desired elapsed time interval may also be automatically adjusted in response to other system conditions. For instance, the elapsed time interval may be adjusted to a shorter time interval to test more often in conditions that are more likely to degrade the Faraday sensor 106, e.g., for a Faraday sensor that is frequently exposed to ions, and/or to high energy ions.

Figure 6:
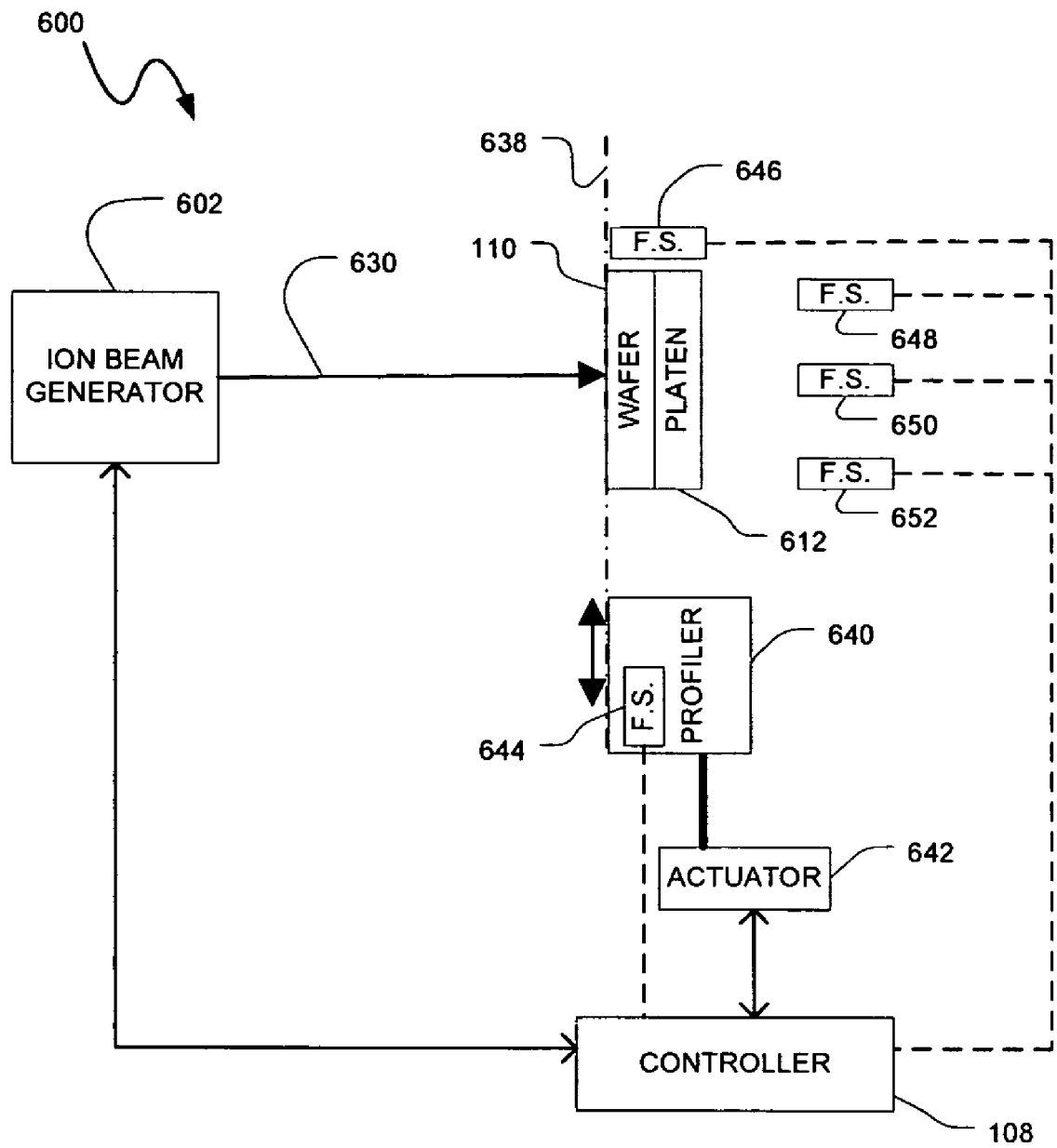
FIG. 6 is a block diagram of an embodiment of an ion implanter including an ion beam generator and differing Faraday sensor positions.

Turning to FIG. 6, a block diagram of an embodiment of an ion implanter 600 including an ion beam generator 602 for generating a well-defined ion beam 630 is illustrated. The ion beam 630 may be directed at the wafer 110 supported by a platen 612. The ion implanter 600 may include a plurality of Faraday sensors at differing positions in the ion implanter 600. One or more of each Faraday sensor may be included in the Faraday sensor test system 104 consistent with the present invention. Each Faraday sensor 644, 646, 648, 650, 652 is illustrated with a phantom connection to the controller 108 which represents the test conductor 124 and primary conductor 122 previously illustrated.

The ion implanter 600 may include a profile Faraday sensor 644 in a traveling profiler 640. The traveling profiler 640 may be driven by the actuator 642 in a plane 638 defined by a position of the wafer 110 during ion implantation in order to measure a profile of the ion beam current in the direction of travel of the traveling profiler 640. A closed loop Faraday sensor 646 for closed loop dose control may also be positioned adjacent to an outside edge of the wafer 110 to measure ion beam current during implant. Since the closed loop Faraday sensor 646 and the profile Faraday sensor 644 on the profiler 640 are heavily utilized and therefore subject to damage, they may each be part of the Faraday sensor test system 104 consistent with the invention. Other Faraday sensors such as set up Faraday sensors 648, 650, and 652 may also be part of the Faraday sensor test system 104 consistent with the invention.

Advantageously, there is provided an automated Faraday sensor test system to automatically test a Faraday sensor in response to a test condition. No human involvement to separately test the Faraday sensor is necessary. The chances for human error are therefore reduced compared a conventional approach of a technician coupling a high voltage across the Faraday sensor. If the test reveals a fault condition, alerts and or other safety precautions can be automatically taken to lessen any resulting damage. When used in an ion implanter, early detection of a fault condition can lessen the amount of scrapped wafers.

Having thus described at least one illustrative embodiment of the invention, various alterations, modifications, and improvements will readily occur to those skilled in the art. Such alterations, modifications, and improvements are intended to be within the scope of the invention. Accordingly, the foregoing description is by way of example only and is not intended as limiting.

What is claimed is:

1. A Faraday sensor test system comprising:
   a Faraday sensor configured to intercept a quantity of ions incident on said Faraday sensor;
   a primary conductor and a test conductor coupled to said Faraday sensor; and
   a controller configured to automatically provide a test current into said test conductor in response to a test condition, said controller further configured to receive a return current from said primary conductor in response to said test current and to compare said return current to a value representative of said test current to determine a condition of a conductive path comprising said test conductor, said Faraday sensor, and said primary conductor;
   wherein said controller comprises a test current source configured to provide said test current, monitoring circuitry, a first switch, and a second switch coupled to a direct path between said test current source and said monitoring circuitry, wherein said monitoring circuitry is configured to compare said value representative of said test current to said return current, said value representative of said test current being a received test current from said test current source on said direct path when said first switch is open and said second switch is closed, said return current being received from said conductive path when said first switch is closed and said second switch is open.

2. The Faraday sensor test system of claim 1, wherein said test conductor is coupled to a first location of said Faraday sensor and said primary conductor is coupled to a second location of said Faraday sensor, said second location different than said first location.

3. The Faraday sensor test system of claim 1, wherein said test condition comprises an elapsed time interval since a previous test of said conductive path.

4. The Faraday sensor test system of claim 1, wherein said test current comprises a DC test current and said return current comprises a DC return current.

5. The Faraday sensor test system of claim 4, wherein if a difference between said DC return current and said value representative of said DC test current is greater than a threshold level, said controller is configured to output a fault signal representative of a fault condition on said conductive path.

6. An ion implanter comprising:
   an ion generating system configured to generate a plurality of ions and direct said plurality of ions to a wafer for implantation; and
   a Faraday sensor test system comprising:
      a Faraday sensor configured to intercept a quantity of said plurality of ions incident on said Faraday sensor;
      a primary conductor and a test conductor coupled to said Faraday sensor; and
      a controller configured to automatically provide a test current into said test conductor in response to a test condition, said controller further configured to receive a return current from said primary conductor in response to said test current and to compare said return current to a value representative of said test current to determine a condition of a conductive path comprising said test conductor, said Faraday sensor, and said primary conductor;
      wherein said controller comprises a test current source configured to provide said test current, monitoring circuitry, a first switch, and a second switch coupled to a direct path between said test current source and said monitoring circuitry, wherein said monitoring circuitry is configured to compare said value representative of said test current to said return current, said value representative of said test current being a received test current from said test current source on said direct path when said first switch is open and said second switch is closed, said return current being received from said conductive path when said first switch is closed and said second switch is open.

7. The ion implanter of claim 6, wherein said test condition comprises a quantity of said wafers implanted since a previous test of said conductive path.

8. The ion implanter of claim 6, wherein said test condition comprises an energy level of said plurality of ions.

9. The ion implanter of claim 6, wherein said test current comprises a DC test current and said return current comprises a DC return current, and wherein if a difference between said DC return current and said value representative of said DC test current is greater than a threshold level, said controller is configured to output a fault signal representative of a fault condition on said conductive path.

10. The ion implanter of claim 9, further comprising a user interface system configured to provide an alert indicative of a presence of said fault condition in response to said fault signal.

11. The ion implanter of claim 9, wherein said controller is further configured to prevent said ion generating system from implanting said plurality of ions into said wafer in response to said fault signal.

12. A method comprising:
   providing a test current into a test conductor coupled to a Faraday sensor through a first switch, said test current provided automatically in response to a test condition;
   receiving a return current from a primary conductor coupled to said Faraday sensor in response to said test current;
   bypassing a conductive path comprising said test conductor, said Faraday sensor, and said primary conductor and providing said test current to monitoring circuitry on a direct path through a second switch;
   measuring a received test current at said monitoring circuitry in response to said test current provided on said direct path; and
   comparing said return current to a value representative of said test current to determine a condition of said conductive path, said value representative of said test current being said received test current.

13. The method of claim 12, wherein said test condition comprises an elapsed time interval since a previous test of said conductive path.

14. The method of claim 12, further comprising implanting a plurality of wafers, and wherein said test condition comprises a quantity of said plurality of wafers implanted since a previous test of said conductive path.

15. The method of claim 12, wherein said test current comprises a DC test current and said return current comprises a DC return current, wherein said method further comprises outputting a fault signal representative of a fault condition on said conductive path if a difference between said DC return current and said value representative of said DC test current is greater than a threshold level.

16. The method of claim 15, wherein said threshold level is 1% of said value representative of said DC test current.

17. The method of claim 12, wherein said providing said test current into said test conductor occurs when no ions are incident on said Faraday sensor.

* * * * *